United States Patent
Caldwell et al.

[11] Patent Number: 5,851,887
[45] Date of Patent: Dec. 22, 1998

[54] DEEP SUB-MICRON POLYSILICON GAP FORMATION

[75] Inventors: Roger F. Caldwell, Milpitas; Jeffrey T. Watt, Mountain View, both of Calif.

[73] Assignee: Cypress Semiconductor Corporation, San Jose, Calif.

[21] Appl. No.: 622,916

[22] Filed: Mar. 27, 1996

Related U.S. Application Data

[63] Continuation of Ser. No. 302,615, Sep. 7, 1994, abandoned.

[51] Int. Cl.$^6$ .................................................... H01L 21/76
[52] U.S. Cl. ...................... 438/295; 438/587; 438/412; 438/700; 438/947
[58] Field of Search ................................ 437/69, 70, 228, 437/924, 984, 40, 41, 50; 148/DIG. 102, DIG. 85, DIG. 86; 438/295, 412, 587, 700, 947, 118, 222, 229, 210, 213

[56] References Cited

U.S. PATENT DOCUMENTS

| | | |
|---|---|---|
| 4,742,459 | 5/1988 | Fisher . |
| 4,746,963 | 5/1988 | Ucheda et al. . |
| 4,868,132 | 9/1989 | Ravaglia ..................................... 437/38 |
| 5,028,559 | 7/1991 | Zdebel et al. . |
| 5,096,848 | 3/1992 | Kawamura . |
| 5,114,872 | 5/1992 | Roselle et al. . |
| 5,120,675 | 6/1992 | Pollack . |
| 5,334,850 | 8/1994 | McElroy et al. . |
| 5,360,753 | 11/1994 | Park et al. . |

FOREIGN PATENT DOCUMENTS

| | | |
|---|---|---|
| 1-303050 | 2/1989 | European Pat. Off. . |
| 59-186343 | 10/1984 | Japan . |
| 61-241941 | 10/1986 | Japan . |
| 63-188952 | 8/1988 | Japan . |
| 2-125418 | 5/1990 | Japan . |
| 2-125444 | 5/1990 | Japan . |

OTHER PUBLICATIONS

Stanley Wolf Ph.D and Richard N. Tauber Ph.D., "Silicon Progressing For The VLSI Era", *Process Technology, Lattice Press, Lattice Press*, pp. 3–12.

*Primary Examiner*—George R. Fourson
*Attorney, Agent, or Firm*—Blakely, Sokoloff, Taylor & Zafman LLP

[57] ABSTRACT

A method for forming a gap in a silicon layer is described. A silicon layer is formed over a substrate. A nitride layer is formed over the silicon layer and an oxide layer is formed over the silicon layer, adjacent to the nitride layer. A portion of the oxide layer is then removed to form an exposed region of the silicon layer. Then an etchant is applied to the exposed region to form an gap of the silicon layer.

18 Claims, 5 Drawing Sheets

DEEP SUB-MICRON POLYSILICON GAP FORMATION

This is a continuation of application Ser. No. 08/302,615, filed Sep. 4, 1994 now abandoned.

FIELD OF THE INVENTION

The present invention relates to the field of semiconductor processing and in particular, to the formation of a gap in a silicon layer for semiconductor devices.

BACKGROUND OF THE INVENTION

A basic requirement of any semiconductor process is the ability to electrically isolate the features of a conductive layer. One prior technique for forming a conductive layer involves depositing a conductive layer (e.g. doped polysilicon) on top of an insulating layer (e.g. silicon dioxide or silicon nitride), applying photoresist over the conductive layer, patterning the conductive layer using photolithography to form a photoresist mask over the conductive layer and etching the conductive layer not covered by the photoresist mask. The areas not covered by photoresist are etched away and the result is conductive features which are electrically isolated from each other by gaps in the conductive layer. However, the prior photoresist techniques had inherent limitations imposed by the photolithography process and the photoresist could only be patterned with relatively large gaps. Because gap dimensions of the photoresist mask determined gap dimensions of the underlying conductive layers, the conductive layers formed using the prior photoresist techniques also exhibited large gaps between the features. The large gaps in turn, reduced the density of devices that could be produced and increased the area occupied by a given number of devices. The low density and increased area in turn led to relatively high processing costs.

Thus, what is needed is a polysilicon layer and process for forming the polysilicon layer that results in a decreased gap dimension between features.

The decreased gap dimension can result in higher density and reduced area. The higher density and reduced area in turn can result in lower processing costs.

SUMMARY OF THE INVENTION

A novel silicon layer and process for forming the silicon layer is described. A silicon layer is formed over a substrate and a nitride layer is formed over the silicon layer and the nitride layer is patterned. An oxide layer is formed over the silicon layer and adjacent to the patterned nitride layer. The oxide layer is thinner near the nitride layer than away from it. A portion of the oxide layer is removed by reducing the thickness of the oxide layer to form an exposed region of the silicon layer where the oxide layer is thinner. An etchant is then applied to the exposed region to form a gap in the silicon layer. Alternatively, a silicon layer is formed over a substrate and a nitride layer is formed over the silicon layer. An oxide layer is formed over the silicon layer and adjacent to the nitride layer. The oxide layer is thinner near the nitride layer than away from it. A portion of the nitride layer is removed to form an exposed region of the silicon layer. An etchant is then applied to the exposed region to form a gap in the silicon layer.

Under an alternative embodiment, an array of memory cells comprises a first source region capable of providing charge carriers, a first drain region capable of receiving the charge carriers from the first source region, a first channel electrically linking the first source region and the first drain region, and a first gate located above the first channel and capable of applying an electric field to the first channel. It also comprises a second source region capable of providing charge carriers, a second drain region capable of receiving the charge carriers from the second source region, a second channel electrically linking the second source region and the second drain region, a second gate located above the second channel and capable of applying an electric field to the second channel, and a gap located between the first gate and the second gate wherein the gap is 0.02 to 0.20 microns.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A novel silicon layer and process for forming the silicon layer is described. In the following detailed description numerous specific details, such as specific conductivity types, doping levels, and process steps, etc., are set forth in order to provide a thorough understanding of the present invention. However, it will be understood by those skilled in the art that the present invention may be practiced without these specific details. In other instances well known semiconductor steps such as cleaning steps, contact steps, and lithography (used, for example, for patterning layers), have not been described in detail so as not to obscure the present invention.

In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Figure 1A:
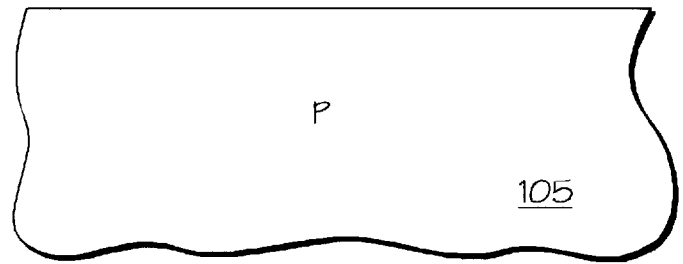
FIG. 1a is an illustration of a cross-sectional view showing a portion of a lightly doped p-type substrate.

FIG. 1a illustrates the starting material used in one embodiment of the present invention. The starting material consists of a lightly doped silicon substrate, either p-type or n-type.

Figure 1B:
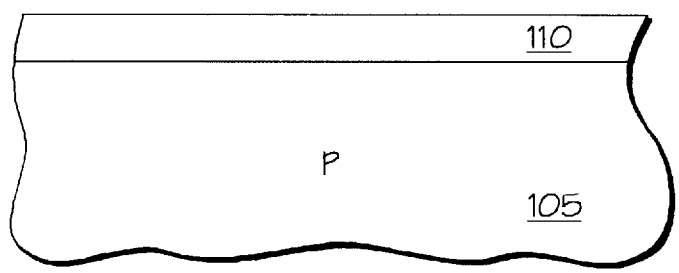
FIG. 1b illustrates the substrate of FIG. 1a after an oxide layer is grown on the surface of the substrate.

Next, oxide layer 110 is formed over substrate 105 as illustrated in FIG. 1b. Oxide layer 110 (e.g. silicon dioxide) is formed by exposing substrate 105 to oxygen. Oxide layer 110 has an approximate thickness of between 30 to 20,000 angstroms. Oxide layer 110 can also be formed by a chemical vapor deposition (CVD) process. Any number of well-known CVD methods can be used.

Figure 1C:
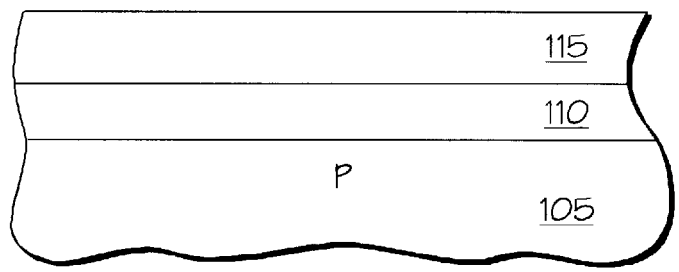
FIG. 1c illustrates the substrate of FIG. 1b after a polysilicon layer is formed on the substrate.

Next, as shown in FIG. 1c, polysilicon layer 115 is formed. In this embodiment, substrate 105 is placed in a chemical vapor deposition reactor. Any conventional low pressure chemical vapor deposition (LPCVD) process can be used. Polysilicon layer 115 is formed with a thickness of between 500 to 5000 angstroms over the entire surface of substrate 105.

Figure 1D:
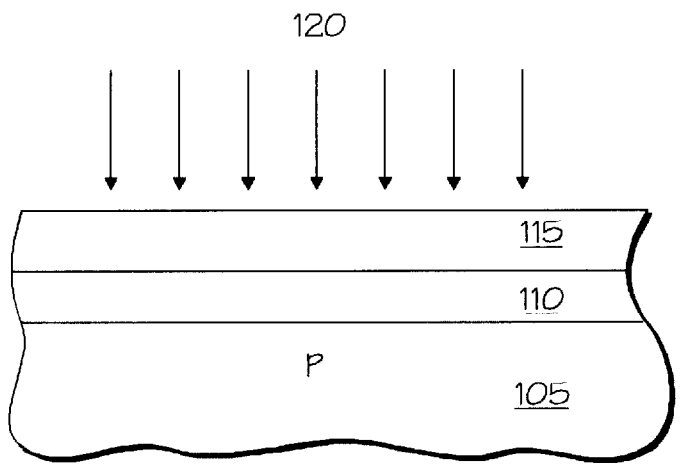
FIG. 1d illustrates the substrate of FIG. 1c during an ion implantation step.

Next, polysilicon layer 115 is doped as illustrated in FIG. 1d. In this step, n-type dopants 120, such as phosphorus or arsenic are implanted into polysilicon layer 115. After this step, polysilicon layer 115 has an average dopant concentration of approximately $10^{19}$ to $10^{20}$ cm$^{-3}$.

Alternatively, p-type dopants such as boron (B) or boron diflouride ($BF_2$) can also be used. Other species or methods of doping can be used, or no dopant at all can be used.

Figure 1E:
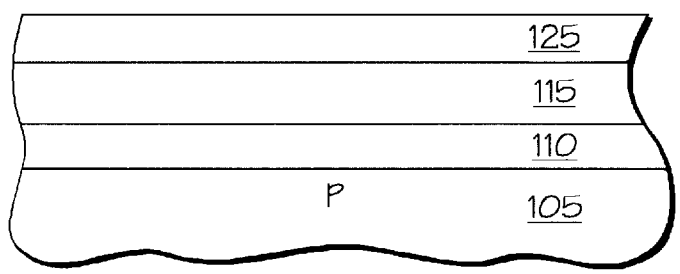
FIG. 1e illustrates the substrate of FIG. 1d after a nitride layer is formed over the substrate.

Next, as shown in FIG. 1e, a nitride layer (e.g. $Si_3N_4$) is formed. Conventional methods for forming LPCVD silicon nitride are used. Nitride layer 125 results with a thickness of 500 to 5000 angstroms.

Figure 1F:
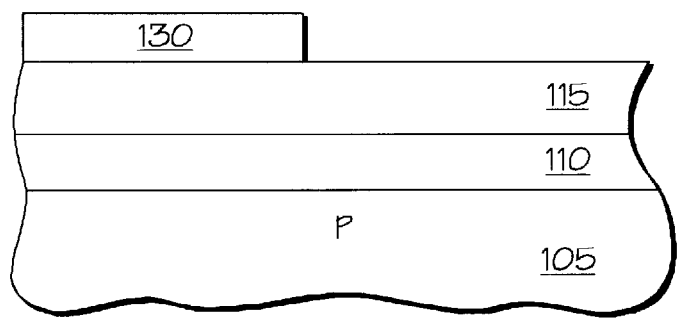
FIG. 1f illustrates the substrate of FIG. 1e after a mask and etch step.

Next, nitride layer 125 is masked and etched to form nitride layer 130, as shown in FIG. 1f. In this step, photoresist is applied over nitride layer 125. The photoresist is patterned using well-known techniques to form a photoresist mask. A highly selective plasma etch, such as $CHF_3/O_2$, is then applied to substrate 105 using conventional plasma etching equipment and processing conditions. The plasma etch attacks the exposed areas of nitride 125 until it reaches polysilicon layer 115. When polysilicon layer 115 is exposed, the etchant keeps polysilicon layer 115 relatively intact. Nitride layer 130 is formed with a thickness of 500 to 5000 angstroms. The edge of nitride layer 130 determines the location of the polysilicon gap formed in later steps.

Figure 1G:
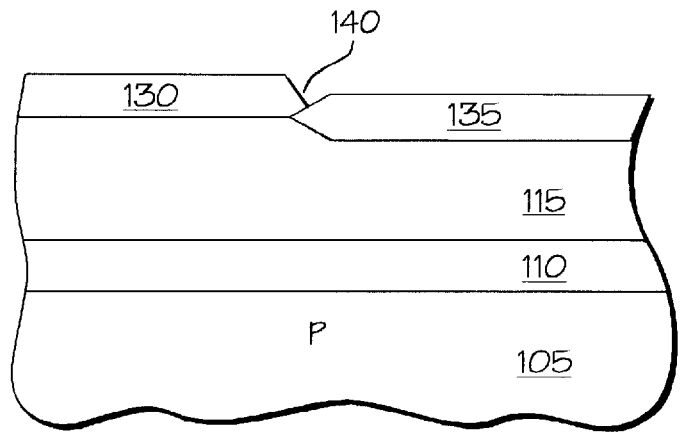
FIG. 1g illustrates the substrate of FIG. 1f after the formation of an oxide layer.
Figure 1H:
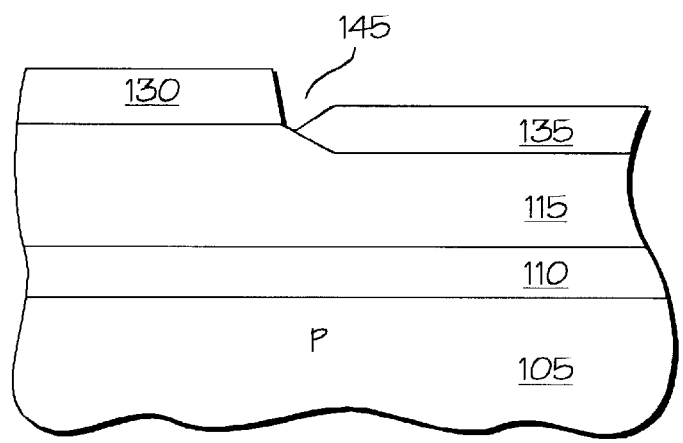
FIG. 1h illustrates the substrate of FIG. 1g after an etch step.

Next, as shown in FIG. 1g, oxide layer 135 is grown over the exposed areas of polysilicon layer 115. In this step, substrate 105 is placed into a furnace with a steam or oxygen ambient at 850 to 950 degrees Celsius for 30 to 60 minutes. Oxide layer 135 results with a thickness of 200 to 2000 angstroms. Oxide layer 135 forms in those areas not covered by nitride layer 130. In those locations where oxide layer 135 meets nitride layer 130, bird's beak 140 is formed as a result of oxide encroachment.

As shown in FIG. 1g, oxide layer 135 has a relatively uniform thickness across most of the layer. However, beginning a certain distance from the edge of nitride layer 130, the thickness of oxide layer 135 decreases with decreasing distance from the edge of nitride layer 130. At the edge of nitride layer 130, the thickness of oxide layer 135 is considerably less than the average thickness of oxide layer 135. However, oxide layer 135 at edge of nitride layer 130 still has a measurable thickness. Beyond the edge of nitride layer 130, oxide layer 135 continues to decrease in thickness with increasing distance away from the edge of nitride layer 130 and increasing distance towards the center of nitride layer 130. In addition, beyond the edge of nitride layer 130, oxide layer 135 resides under nitride layer 130. After a short distance away from the edge of nitride layer 130, oxide layer 135 no longer exists.

Next, exposed region 145 is formed by etching oxide layer 135. In this step, oxide layer 135 is exposed to an etchant such as $CHF_3/O_2$ for 5 seconds to 1 minute at 0 to 60 degrees Celsius using conventional plasma etch equipment. Using this short period of time, the etchant only exposes a small portion of polysilicon layer 115 to form exposed region 145. The other regions of polysilicon layer 115 remains covered by nitride layer 130 or oxide layer 135. In this step, the dimension characteristics of bird's beak 140 is critical. The decreasing thickness of oxide layer 135 allows for gradual exposure of polysilicon layer 115 when oxide layer 135 is exposed to an etchant. This gradual exposure of polysilicon layer 115 provides enhanced controllability of the dimensions of exposed region 145. Thus, exposed region 145 can be produced with very small and precise dimensions. As the exposure time to the etchant increases, the area of exposed region 145 increases. Consequently, the dimensions of exposed region 145 can be controlled by controlling the etchant exposure time and an exposed region 145 with very small dimensions can be achieved by reducing the etchant exposure time. In addition, the controllability (i.e. the sensitivity of the dimensions of exposed region 145 under changes in etchant exposure time) depends on the dimensional characteristics of bird's beak 140. Dimensional characteristics of bird's beak 140 can be changed by adjusting nitride thickness, oxide thickness and oxide growth conditions.

In this embodiment, the oxide etch process does remove some nitride. The oxide etch process used has a nitride to oxide removal ratio of 1:5. Exposed region 145 can also be formed using an oxide etch process with a nitride to oxide removal ratio of 1:1 or any ratio between 1:5 to 1:1. The desired ratio can be selected by adjusting gas flow rates, electrode gap dimensions and power settings. Moreover, exposed region 145 can also be formed by etching nitride layer 130. Here, an etch process would be used with a nitride to oxide removal ratio of 5:1. Etch processes with a ratio between 1:1 and 5:1 can also be used.

In this embodiment, exposed region 145 can be formed by exposing the entire surface of nitride layer 130 and oxide layer 135 to an etchant such as $CHF_3/O_2$. Alternatively, exposed region 145 can also be formed by only exposing those regions of nitride layer 130 and oxide layer 135 that are near the intended location of the sub-micron gap. This selective exposure to etchant can be accomplished by the addition of a mask step prior to exposing substrate 105 to etchant. The mask covers those regions away from the intended location of the sub-micron gap but also allows etchant to react in the region near the intended location of the sub-micron gap. With this mask, oxide layer 135 in those regions away from the intended location of the sub-micron gap remains intact and retains its original thickness.

Figure 1I:
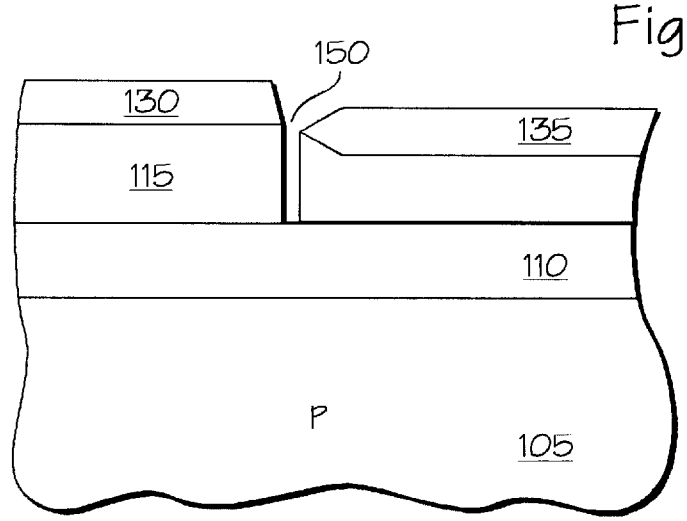
FIG. 1i illustrates the substrate of FIG. 1h after a second etch step.

Next, as shown in FIG. 1i, sub-micron gap 150 is formed by etching the exposed regions of polysilicon layer 115. In this step, substrate 105 is exposed to an anisotropic etchant with high selectivity to both silicon dioxide and silicon nitride. Etchants such as $Cl_2$ or HBr can be used for 30 seconds to 5 minutes at 0 to 60 degrees Celsius using conventional plasma etching equipment. The etchant attacks the exposed regions of polysilicon layer 115 but keeps nitride layer 130 and oxide layer 135 relatively intact. In addition, the etchant etches polysilicon layer 115 predominantly in the vertical direction. In this manner, sub-micron gap 150 is formed. The width of sub-micron gap 150 can be any width between 0.02 to 0.20 microns.

Under a second embodiment of the present invention, polysilicon layer 115 is formed by placing substrate 105 into a CVD reactor at a temperature of 560±5 degrees Celsius. In this embodiment, polysilicon layer 115 is formed with a thickness of 2000±200 angstroms over the entire surface of substrate 105.

Next, polysilicon layer 115 is doped with phosphorus using ion implantation. After this step, polysilicon layer 115 has an average dopant concentration of about $10^{20}$ cm$^{-3}$.

Next, nitride layer 125 is formed by placing substrate 105 in a CVD reactor at a temperature of 800±60 degrees Celsius. Nitride layer 125 has a thickness of 2150±100 angstroms. Next, nitride layer 125 is masked and etched using a highly selective plasma etch ($CHF_3/O_2$) for 1 minute at 12±1 degrees Celsius.

Next, oxide layer 135 is grown by placing substrate 105 into a furnace with an oxygen ambient at 850±5 degrees Celsius for 40±10 minutes. Oxide layer 135 has a thickness of 400±40 angstroms. Next, exposed region 145 is formed by etching oxide layer 135. Oxide layer 135 is exposed to an etchant ($CHF_3/C_2F_6$) for 10±1 seconds at 12±1 degrees Celsius. Exposed region 145 can also be formed by selective exposure of nitride layer 130 and oxide layer 135 using a mask step prior to etching as described under the first embodiment.

Next, sub-micron gap 150 is formed by etching exposed region 145 of polysilicon layer 115. In this step, substrate 105 is exposed to an anisotropic etchant with high selectivity to both silicon dioxide and silicon nitride ($Cl_2$ and HBr) for 30 seconds to 5 minutes at 40±1 degrees Celsius using plasma etching equipment. The gas flow rate is 80 standard cubic centimeters. The electrode gap dimensions is 0.8 centimeters and the power through the electrodes is 280 watts. In this manner, sub-micron gap 150 is formed. The width of sub-micron gap 150 can be any width between 0.05 to 0.15 microns.

Figure 2:
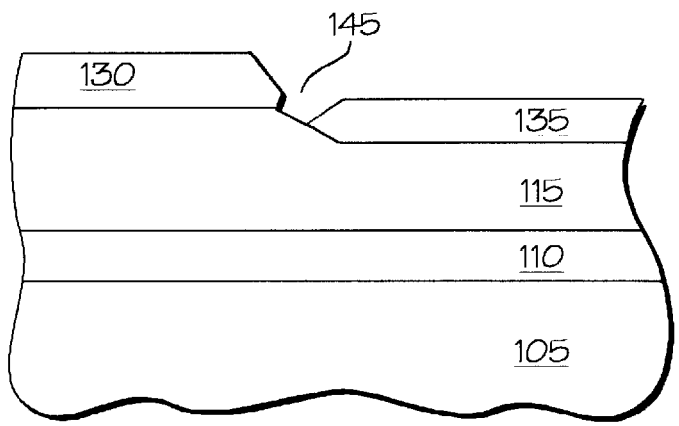
FIG. 2 illustrates the substrate of FIG. 1g after an etch step under a third embodiment of the present invention.

Under a third embodiment of the present invention, oxide layer 110, polysilicon layer 115, oxide layer 135 and bird's beak 140 are formed as illustrated in FIGS. 1a through 1g. Exposed region 145 is formed by etching oxide layer 135 and nitride layer 130 as shown in FIG. 2. In this step, oxide layer 135 and nitride layer 130 is exposed to an etchant such as $CHF_3/O_2$ for 10±1 seconds at 12±1 degrees Celsius. Plasma etch equipment is used with gas flow rates of 20 standard cubic centimeters (sccm) for $C_2F_6$ and 30 sccm for $CHF_6$. 600 watts of power is used through the electrodes. The nitride to oxide removal ratio is 1:2. Exposed region 145 can also be formed by selective exposure of nitride layer 130 and oxide layer 135 using a mask step prior to etching as described under the first embodiment.

Next, sub-micron gap 150 is formed by etching exposed region 145 of polysilicon layer 115. In this step, substrate 105 is exposed to an anisotropic etchant with high selectivity to both silicon dioxide and silicon nitride ($Cl_2$ and HBr) for 30 seconds to 5 minutes at 40±1 degrees Celsius using plasma etching equipment. The gas flow rate is 80 sccm. The electrode gap dimensions is 0.8 centimeters and the power through the electrodes is 280 watts. In this manner, polysilicon gap 150 is formed, with a width of 0.02 to 0.20 microns.

Figure 3A:
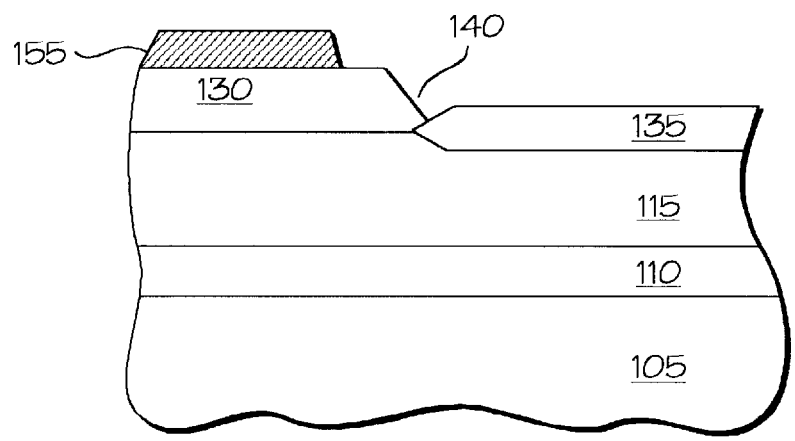
FIG. 3a illustrates the substrate of FIG. 1g after a mask step under a fourth embodiment of the present invention.
Figure 3B:
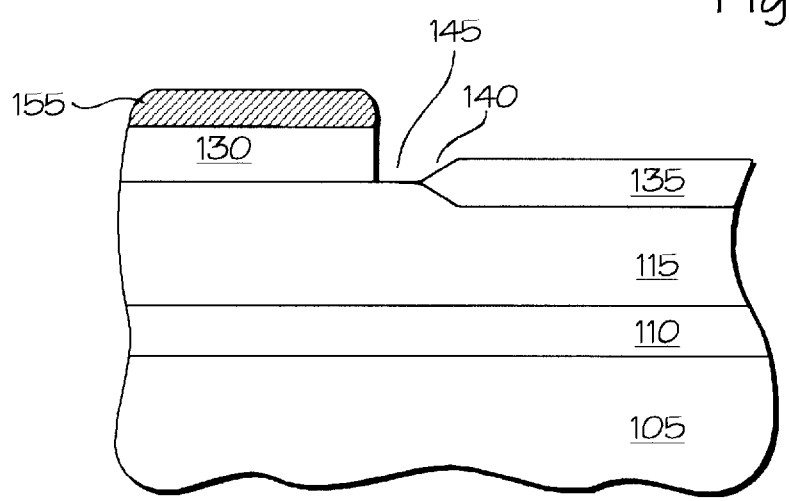
FIG. 3b illustrates the substrate of FIG. 1g after an etch step under a fourth embodiment of the present invention.

Under a fourth embodiment of the present invention, oxide layer 110, polysilicon layer 115, oxide layer 135 and bird's beak 140 are formed as illustrated in FIGS. 1a through 1g. In this step, nitride layer 130 is masked using photolithography. Mask 155 is formed such that the edge of mask 155 is located over the intended location of one edge of the sub-micron gap as shown in FIG. 3a. The intended location of the second edge of the sub-micron gap is the tip of bird's beak 140. Nitride layer 130 is then exposed to $CHF_3/O_2$ for 10±1 seconds at 12±1 degrees Celsius using plasma etch equipment. The gas flow rate is 30 sccm and the power through the electrodes is 250 watts. The nitride to oxide removal ratio is 3:1. Exposed region 145 is formed as shown in FIG. 3b.

Next, sub-micron gap 150 is formed by etching exposed region 145 of polysilicon layer 115. In this step, substrate 105 is exposed to an anisotropic etchant with high selectivity to both silicon dioxide and silicon nitride ($Cl_2$ and HBr) for 30 seconds to 5 minutes at 40±1 degrees Celsius using plasma etching equipment. The gas flow rate is 80 sccm. The electrode gap dimensions is 0.8 centimeters and the power through the electrodes is 280 watts. In this manner, polysilicon gap 150 is formed, with a width of 0.02 to 0.20 microns.

Figure 4A:
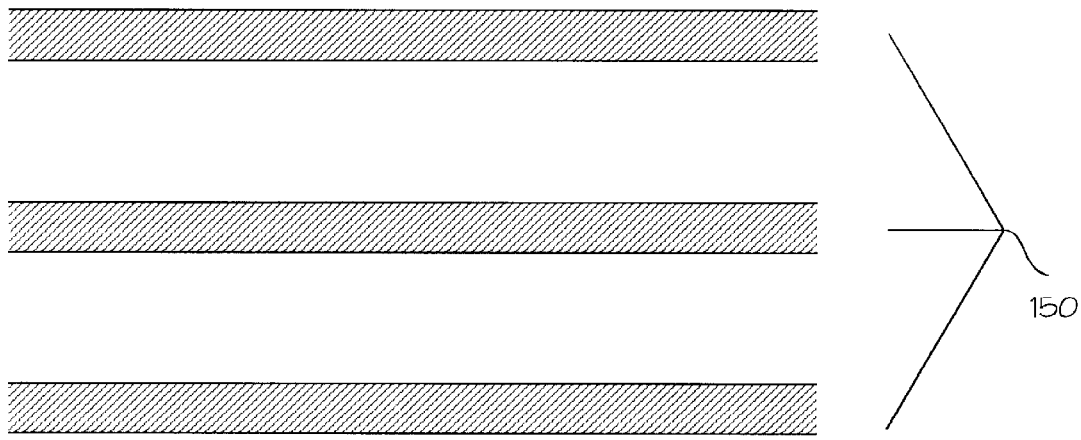
FIG. 4a illustrates a top view of the substrate after the formation of sub-micron gaps.

Under a fifth embodiment of the present invention, polysilicon gap 150 of the first, second, third or fourth embodiment is used to form an array of memory cells. A p-type or n-type lightly doped silicon substrate is used as the starting material. An insulating layer is formed over the substrate. The insulating layer can be oxide layer 110 as described under the first embodiment. A silicon layer is then formed over the insulating layer. This silicon layer can be polysilicon layer 115 as described under the first embodiment. Next, a series of sub-micron gaps 150 is formed in the silicon layer using the process of the first, second, third or fourth embodiment. FIG. 4a illustrates a top view of the substrate after the formation of sub-micron gap 150. Sub-micron gap 150 can be any width between 0.02 to 0.20 microns. The desired gap dimension can be achieved by adjusting process parameters of the first, second, third or fourth embodiment.

Figure 4B:
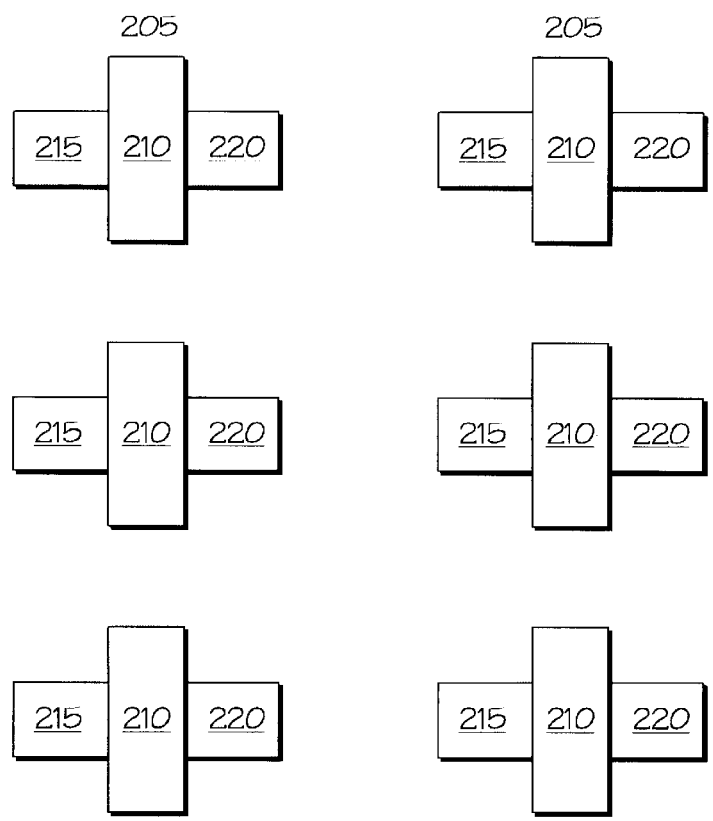
FIG. 4b illustrates a top view of the substrate of FIG. 4a after the formation of transistors and gates.

After sub-micron gaps 150 are formed, the silicon layer and insulating layer are both masked and etched to form columns 205 as illustrated in FIG. 4b. After the etch step, a series of gates 210 are formed in each column. Source regions 215 and drain regions 220 are then formed by diffusion or ion implantation of dopants. Phosphorus or arsenic can be used as dopants to form NMOS transistors. Boron or boron diflouride can be used as dopants to form PMOS transistors. The region beneath each gate 210 of the substrate and between each corresponding source region 215 and drain region 220 forms the channel of the transistor. Using well-known techniques, the transistors of FIG. 4b can be linked to form a read only memory device, an erasable read only memory device, an electrically erasable read only memory device, a static random access memory device and a dynamic random access memory device.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a novel silicon layer and process for forming the silicon layer has been described.

What is claimed is:

1. A method, comprising the steps of:
    a. growing an oxide layer over a polysilicon-containing layer to form a bird's beak in a region over said polysilicon-containing layer, said oxide layer being adjacent to a nitride layer disposed over said polysilicon-containing layer, said bird's beak being further disposed at least partially beneath said nitride layer;
    b. etching said oxide layer to expose said polysilicon-containing layer at said region; and
    c. etching completely through said exposed region of said polysilicon-containing layer to form a plurality of distinct polysilicon-containing bodies.

2. The method of claim 1 further comprising the step of:
    removing a portion of said nitride layer to form an exposed region of said polysilicon-containing layer.

3. The method of claim 1 wherein the step of etching said polysilicon-containing layer at said region comprises anisotropically etching with selectivity to both silicon dioxide and silicon nitride.

4. The method of claim 1 wherein said polysilicon-containing layer further comprises a dopant.

5. The method of claim 1 wherein said gap is 0.02 to 0.20 microns in width.

6. A method of forming a gap in a polysilicon layer comprising the steps of:
    a. growing an oxide layer over a polysilicon layer to form a bird's beak in a region over said polysilicon layer, said oxide layer being adjacent to a nitride layer disposed over said polysilicon layer, said bird's beak being further disposed beneath said nitride layer;
    b. etching said oxide layer to expose said polysilicon layer at said region;
    c. forming a gap in said polysilicon layer at said region such that said polysilicon layer is separated into at least two distinct regions of polysilicon.

7. The method of claim 6 further comprising the step of:
    removing a portion of said nitride layer to form an exposed region of said polysilicon layer before said step of forming gaps in said polysilicon layer.

8. The method of claim 6 further comprising the step of:
    doping said polysilicon layer before growing said oxide layer.

9. The method of claim 6 further comprising the step of:
    patterning said polysilicon layer into gate electrodes.

10. The method of claim 6 wherein said step of forming a gap in said polysilicon layer comprises anisotropically etching said polysilicon layer with selectivity to both silicon dioxide and silicon nitride to etch said polysilicon layer.

11. The method of claim 6 wherein at least one of said gaps is 0.02 to 0.20 microns in width.

12. A method of forming a transistor comprising the steps of:
    a. growing an oxide layer over a polysilicon layer to form two bird's beaks in regions over said polysilicon layer, said oxide layer being adjacent to a nitride layer disposed over said polysilicon layer, said bird's being further disposed beneath said nitride layer, said polysilicon layer being disposed over a gate oxide disposed on a substrate;
    b. etching said oxide layer to expose said polysilicon layer at said regions;
    c. forming gaps in said polysilicon layer by etching all of said polysilicon layer at said regions;
    d. patterning said polysilicon layer into a gate electrode; and
    e. forming drain and source regions in said substrate adjacent to said gate electrode.

13. The method of claim 12 further comprising the step of:
    removing a portion of said nitride layer to form an exposed region of said polysilicon layer before said step of forming gaps in said polysilicon layer.

14. The method of claim 12 further comprising the step of:
    doping said polysilicon layer before growing said oxide layer.

15. The method of claim 12 wherein a distance between said gaps defines a width of said gate electrode.

16. The method of claim 12 wherein said step of forming gaps in said polysilicon layer further comprises anisotropically etching said polysilicon layer with selectivity to both silicon dioxide and silicon nitride.

17. The method of claim 12 further comprising the step of:
    forming contact structures on said source and drain regions.

18. The method of claim 12 wherein at least one of said gaps is 0.02 to 0.20 microns in width.

* * * * *